United States Patent [19]

Shiozawa et al.

[11] Patent Number: 5,345,292

[45] Date of Patent: Sep. 6, 1994

[54] ILLUMINATION DEVICE FOR PROJECTION EXPOSURE APPARATUS

[75] Inventors: Takahisa Shiozawa, Kawasaki; Masato Muraki, Inagi; Hiroyuki Ishii, Yokohama; Shigeru Hayata, Kodaira, all of Japan

[73] Assignee: Canon Kabushiki Kaisha, Tokyo, Japan

[21] Appl. No.: 40,991

[22] Filed: Mar. 31, 1993

[30] Foreign Application Priority Data

Mar. 31, 1992 [JP] Japan .................................. 4-108632

[51] Int. Cl.$^5$ ........................ G03B 27/54; G03B 27/42
[52] U.S. Cl. .......................................... 355/67; 355/53
[58] Field of Search .................... 355/53, 67, 71, 55; 362/268

[56] References Cited

U.S. PATENT DOCUMENTS

| | | | |
|---|---|---|---|
| 3,795,446 | 3/1974 | Houston | 355/78 |
| 3,887,816 | 6/1975 | Colley | 250/571 |
| 4,497,015 | 1/1985 | Konno et al. | 362/268 |
| 4,498,742 | 2/1985 | Uehara | 350/523 |
| 4,521,082 | 6/1985 | Suzuki et al. | 350/405 |
| 4,634,240 | 1/1987 | Suzuki et al. | 350/508 |
| 4,637,691 | 1/1987 | Uehara et al. | 350/432 |
| 4,645,924 | 2/1987 | Suzuki et al. | 250/236 |
| 4,780,747 | 10/1988 | Suzuki et al. | 355/68 |
| 4,830,498 | 5/1989 | Nishimoto et al. | 356/400 |
| 4,851,978 | 7/1989 | Ichihara | 362/268 |
| 4,924,257 | 5/1990 | Jain | 355/53 |
| 4,931,830 | 1/1990 | Suwa et al. | 355/71 |
| 4,939,630 | 7/1990 | Kikuchi et al. | 362/268 |
| 4,974,919 | 12/1990 | Muraki et al. | 350/6.6 |
| 4,988,188 | 1/1991 | Ohta | 353/122 |
| 5,061,956 | 10/1991 | Takubo et al. | 355/55 |
| 5,091,744 | 2/1992 | Omata | 355/53 |
| 5,144,362 | 9/1992 | Kamon et al. | 355/53 |
| 5,153,773 | 10/1992 | Muraki et al. | 359/619 |
| 5,237,367 | 5/1993 | Kudo | 355/67 |
| 5,245,384 | 9/1993 | Mori | 355/67 |

FOREIGN PATENT DOCUMENTS

| | | |
|---|---|---|
| 0293643 | 12/1988 | European Pat. Off. . |
| 0346844 | 12/1989 | European Pat. Off. . |
| 0437376 | 7/1991 | European Pat. Off. . |
| 2835363 | 3/1980 | Fed. Rep. of Germany . |
| 3933308 | 5/1990 | Fed. Rep. of Germany . |
| 56-81813 | 7/1981 | Japan . |
| 58-43416 | 3/1983 | Japan . |
| 58-160914 | 9/1983 | Japan . |
| 59-143146 | 8/1984 | Japan . |
| 61-91662 | 5/1986 | Japan . |

OTHER PUBLICATIONS

Kamon, et al., "Photolithography System Using Annular Illumination", Japanese Journal of Applied Physics, vol. 30, No. 11B, 1991, pp. 3021–3029, Nov. 1991.
Patent Abstracts of Japan, Kokai No. 63-293,547, vol. 13, No. 125, Mar. 1989.
Fukuda et al., "Nikkei Microdevices", Jul. 1990, pp. 108–114.

*Primary Examiner*—Richard A. Wintercorn
*Attorney, Agent, or Firm*—Fitzpatrick, Cella, Harper & Scinto

[57] ABSTRACT

An illumination device, includes a secondary light source forming system having a deflecting member with a conical light deflecting surface for transforming received light into substantially ring-like light, the secondary light source forming system forming a ring-like secondary light source by using the ring-like light; and an optical system for projecting divergent lights from portions of the secondary light source obliquely onto a surface to be illuminated so that the projected lights are superposed one upon another on the surface.

60 Claims, 18 Drawing Sheets

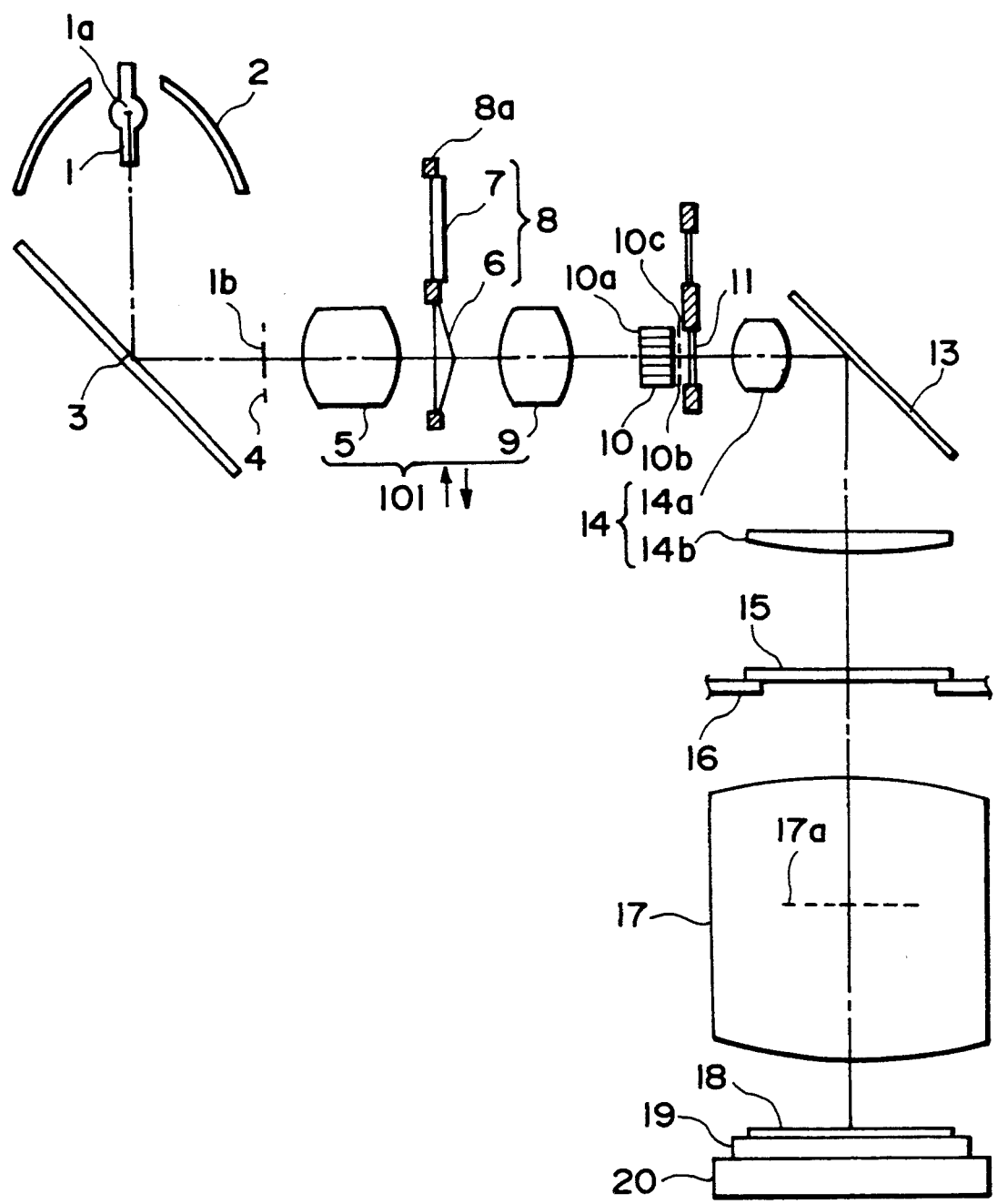
F I G. 1

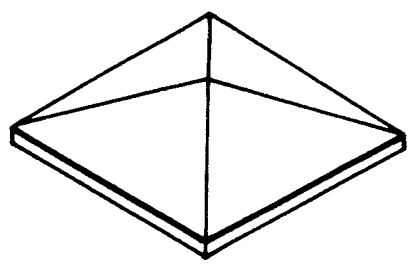
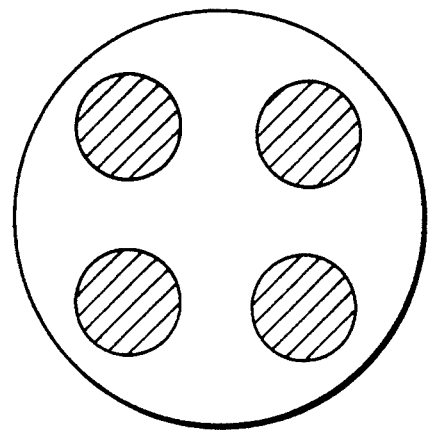
F I G. 7A  F I G. 7B
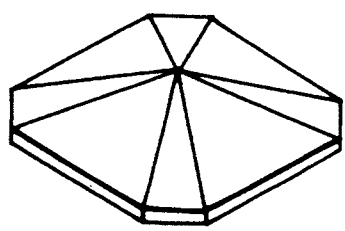
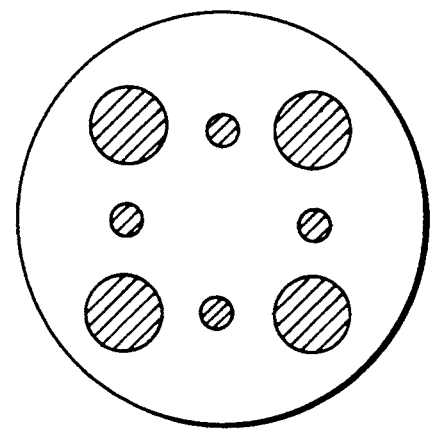
F I G. 8A  F I G. 8B

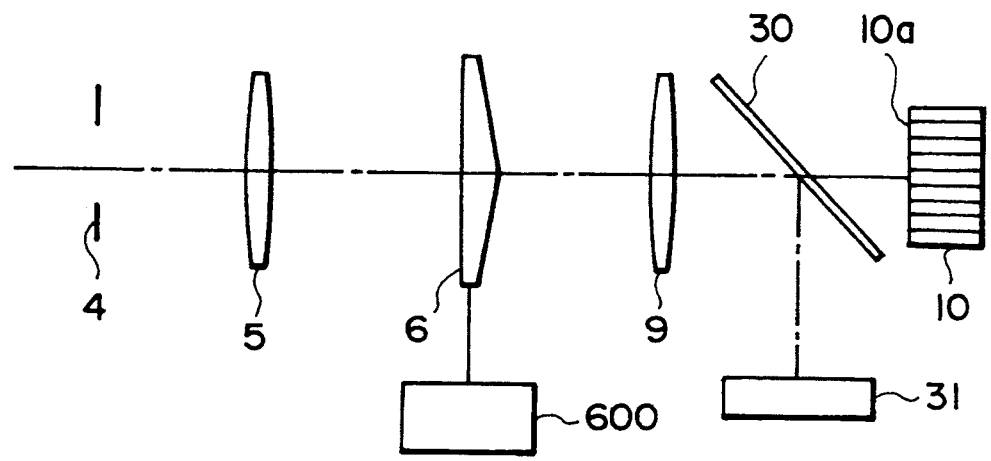
F I G. 9
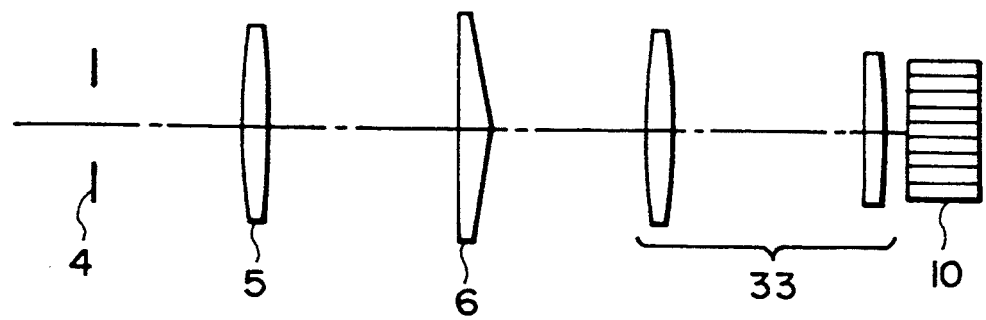
F I G. 10A
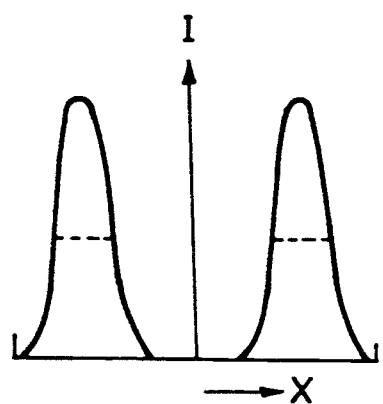
F I G. 10B
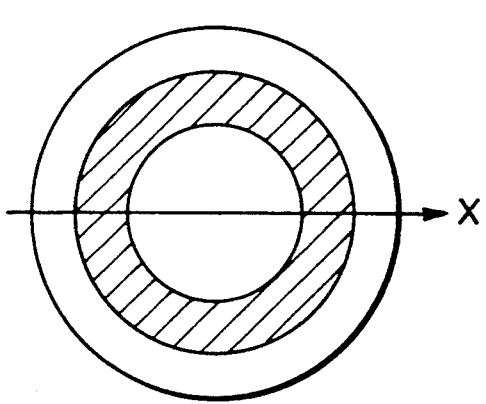
F I G. 10C

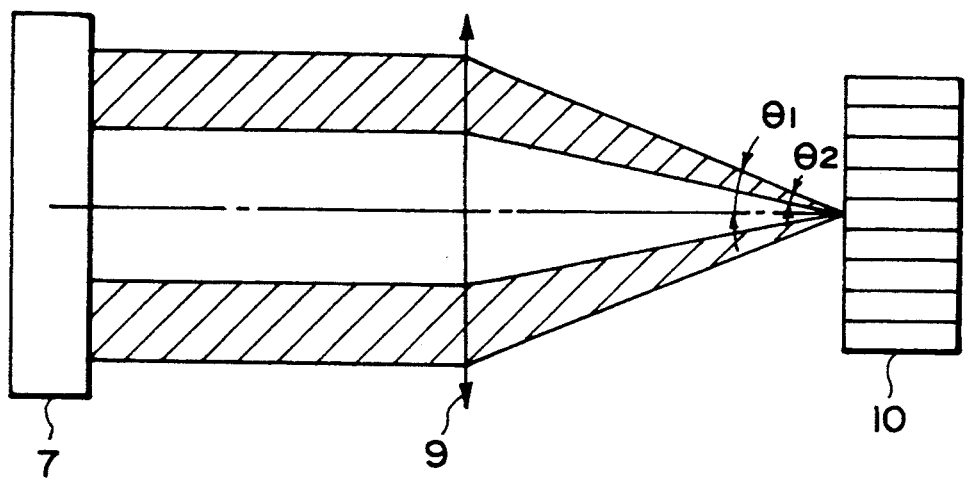
F I G. 11A
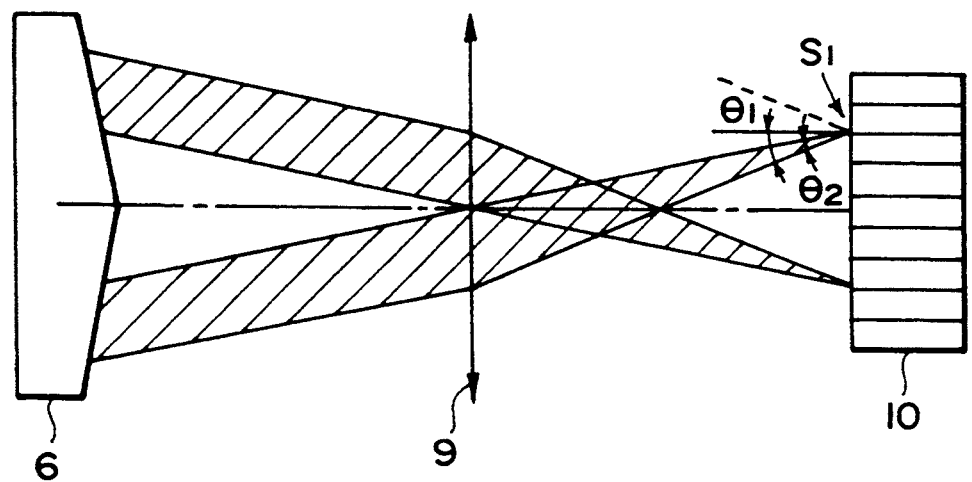
F I G. 11B

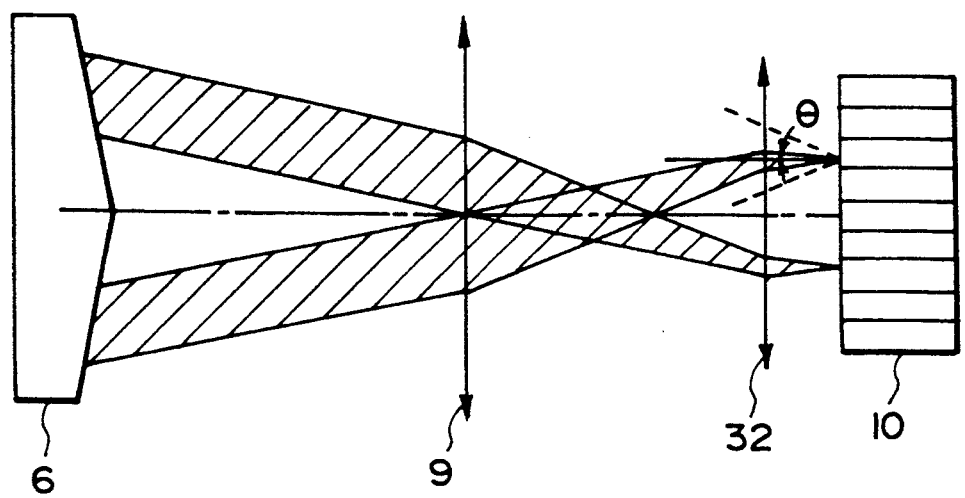
F I G. 12A
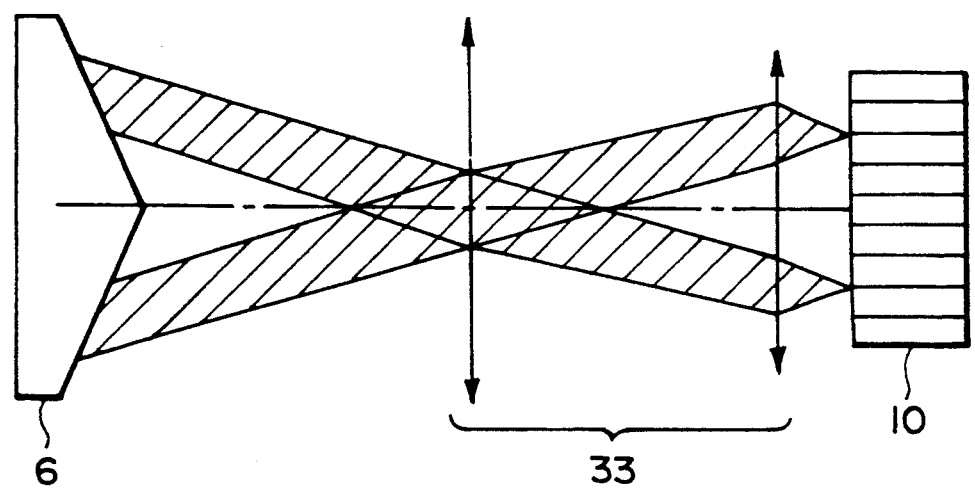
F I G. 12B

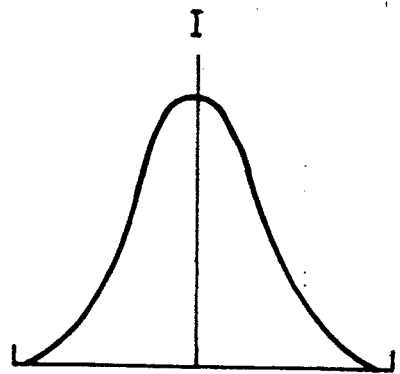
F I G. 13A
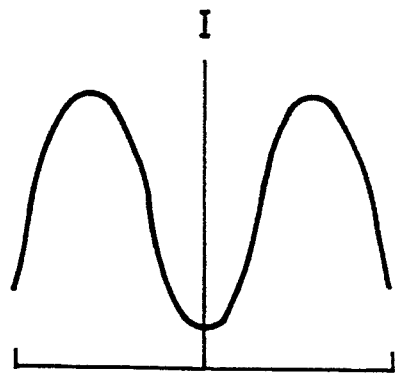
F I G. 13B
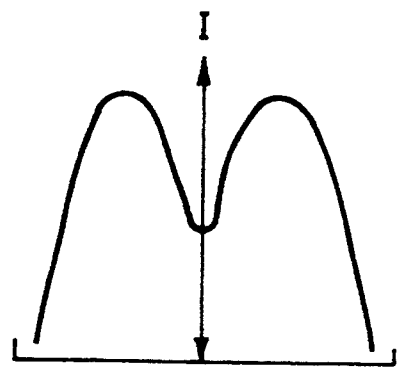
F I G. 14A
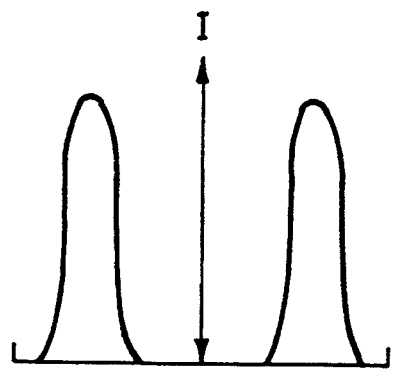
F I G. 14B

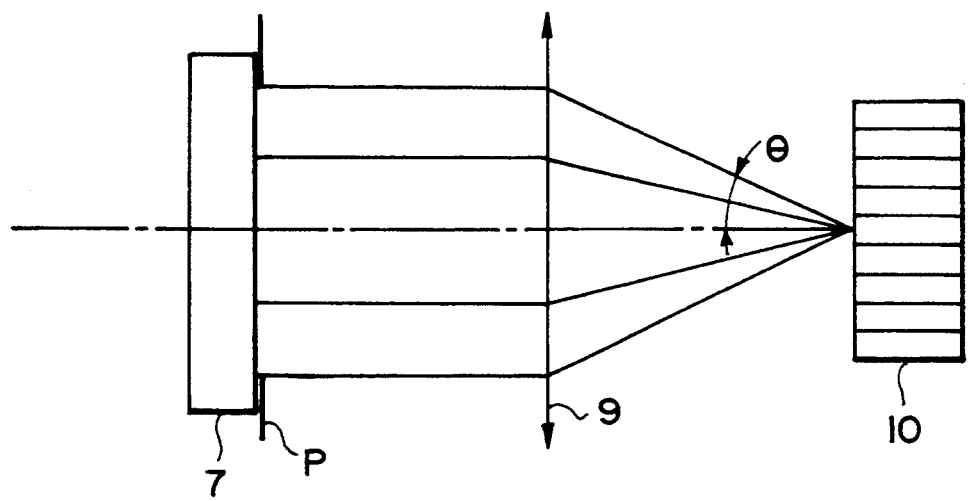
F I G. 15A
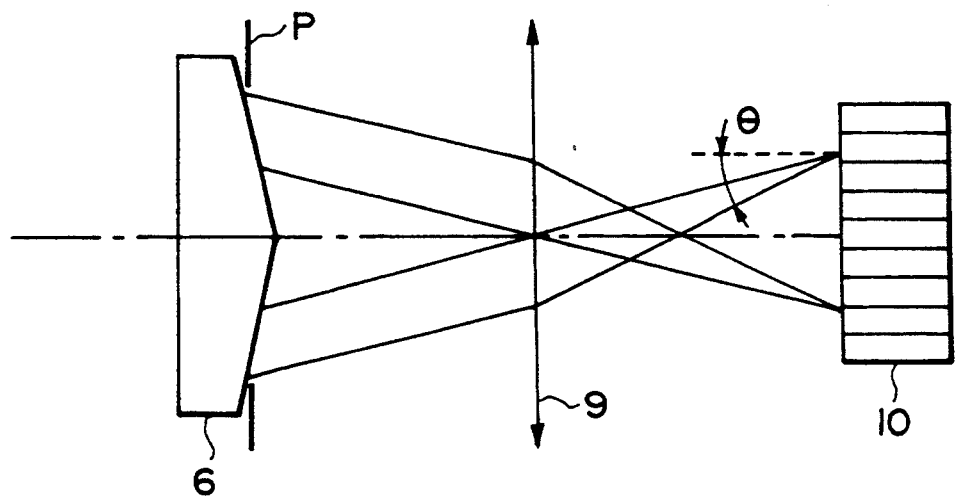
F I G. 15B
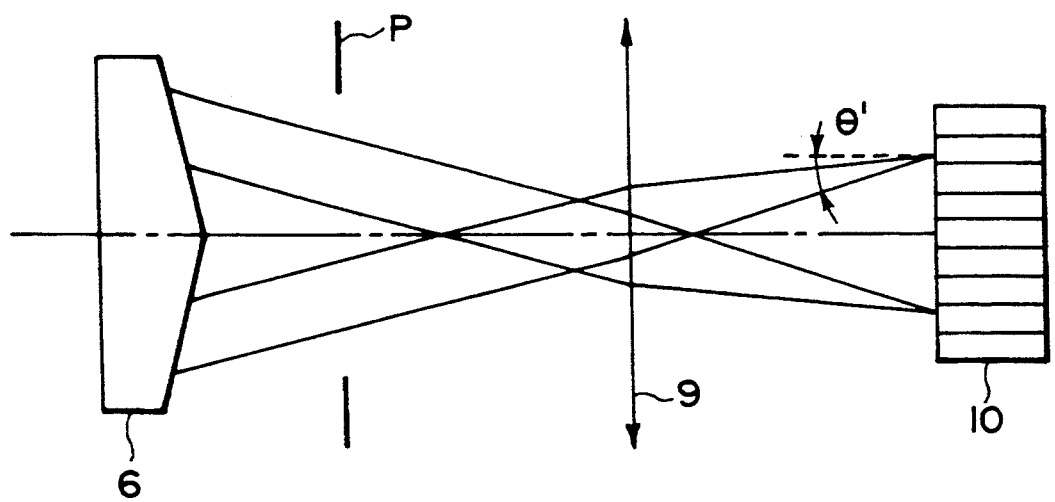
F I G. 15C

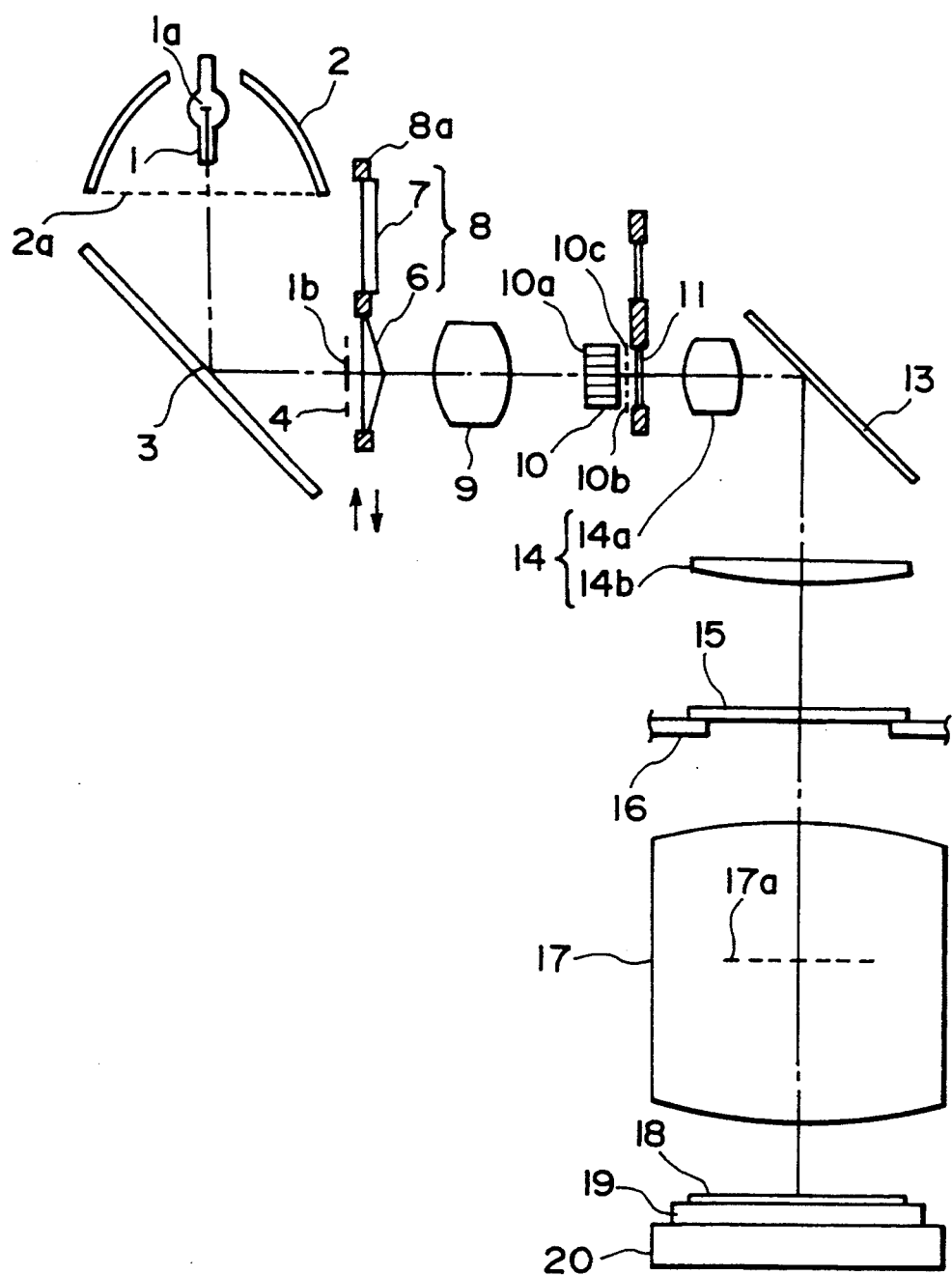
F I G. 16

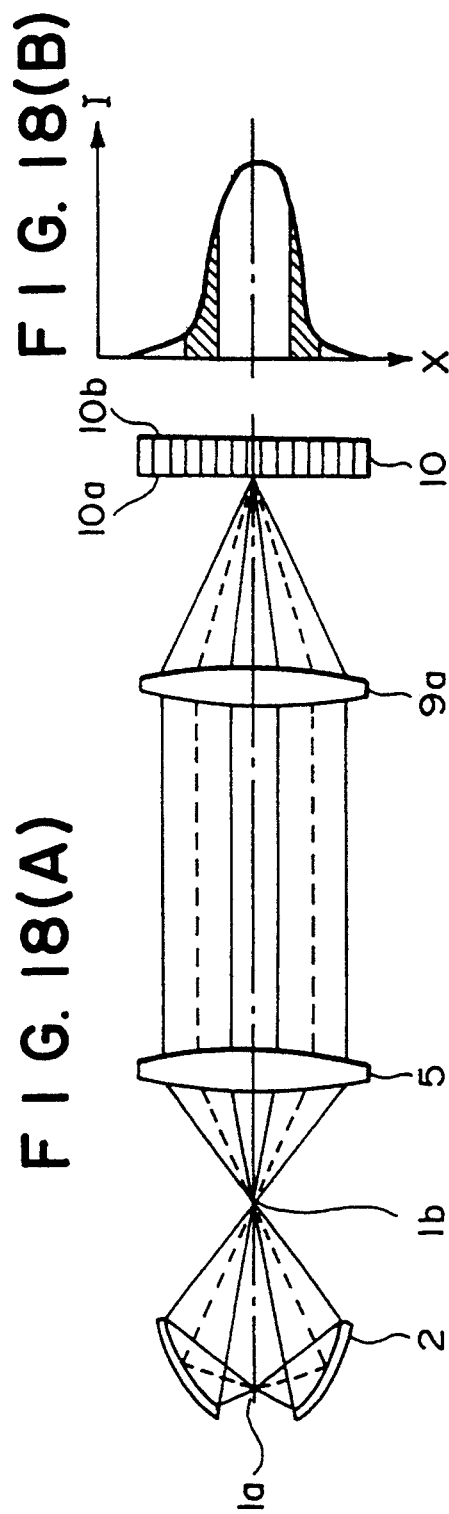

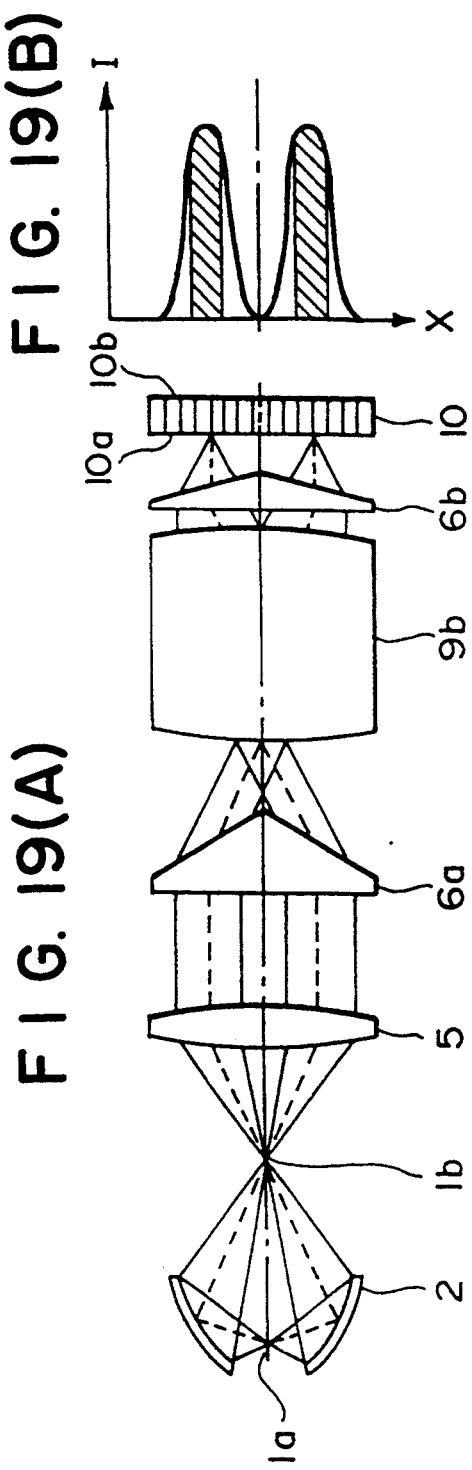

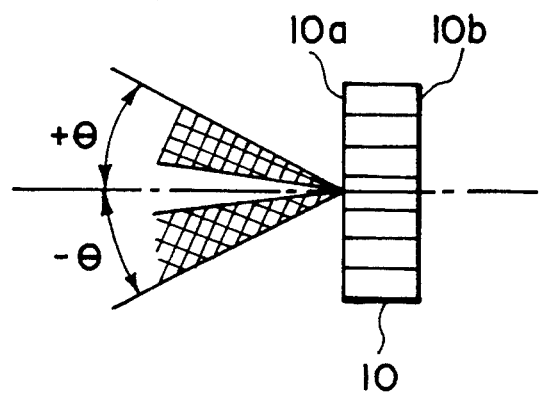
F I G. 20A
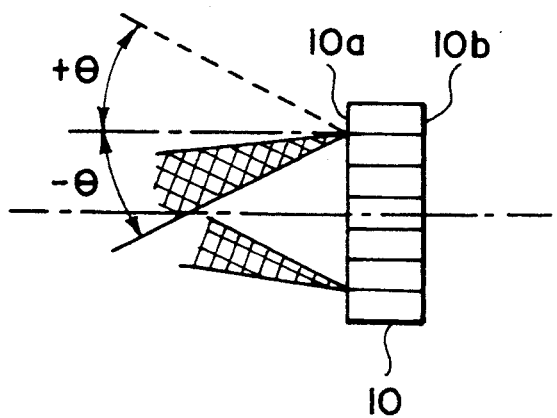
F I G. 20B
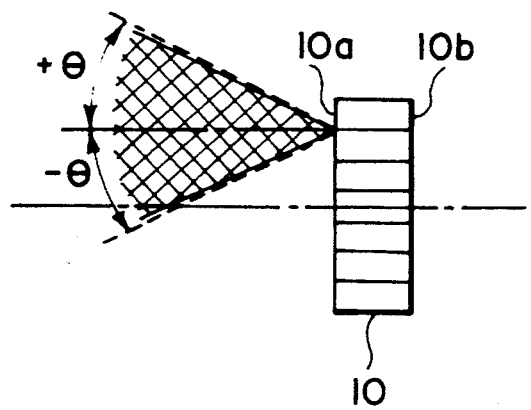
F I G. 20C

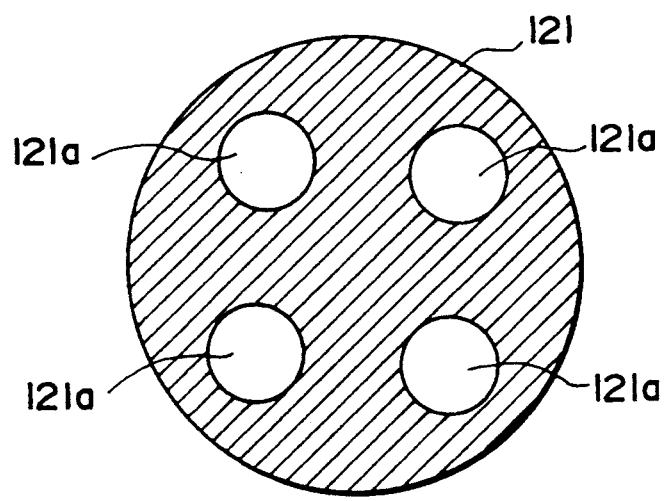
F I G. 21

ILLUMINATION DEVICE FOR PROJECTION EXPOSURE APPARATUS

FIELD OF THE INVENTION AND RELATED ART

This invention relates to an illumination device and a projection exposure apparatus using the same. More particularly, the invention is concerned with an illumination device usable in a microdevice manufacturing exposure apparatus (called a stepper) for illuminating a pattern formed on a reticle in a manner easily attaining high resolution. In another aspect, the invention is concerned with a projection exposure apparatus using such an illumination device.

Semiconductor device manufacturing technology has recently been advanced significantly and, along with this, the fine processing technique has been improved considerably. Particularly, the optical processing technique has pressed the fine processing into a submicron region, with the manufacture of a device of 1-megabit DRAM. A conventionally adopted method for improving the resolution is mainly to enlarge the numerical aperture (NA) of an optical system while fixing an exposure wavelength. Recently, however, it has been proposed and practiced to use an exposure wavelength of i-line in place of g-line, in an attempt to improve the resolution in accordance with an exposure method using an ultra-high pressure Hg lamp.

Along with the advancement of using g-line or i-line as the exposure wavelength, the resist process itself has been advanced. Such improvements in the optical system and in the process together have accomplished rapid advancement of optical lithography.

Generally it is known that the depth of focus of a stepper is in inverse proportion to the square of the NA. It means that enhancing the resolution into a submicron order necessarily results in a problem of decreased depth of focus.

In consideration of this problem, many proposals have been made to use shorter wavelengths, as represented by an excimer laser, for enhancement of the resolution. It is known that the effect of using a shorter wavelength is in inverse proportion to the wavelength, and the shorter the wavelength is, the deeper the depth of focus is.

On the other hand, independently of using light of shorter wavelength, many proposals have been made to use a phase shift mask (phase shift method), in an attempt to improve the resolution. According to this method, a mask of conventional type is locally provided with a thin film that imparts to light incident on it a phase shift of 180 deg. relative to the light incident on the remaining portion. An example has been proposed by Levenson of the IBM corporation. Here, if the wavelength is denoted by $\lambda$, the parameter is denoted by $k_1$ and the numerical aperture is denoted by NA, then the resolution RP can be give by:

$$RP = k_1 \lambda / NA$$

It is known that the parameter $k_1$, whose practical range is usually taken as 0.7-0.8, can be improved to about 0.35 with this phase shift method.

There are many varieties of such a phase shift method, as referred to in a paper by Fukuda et al ("Nikkei Microdevices", July 1990, from page 108).

However, there remains many problems in practically using a phase shift mask of spatial frequency modulation type to improve the resolution. Examples are as follows:

(1) Unestablished technique for forming a phase shift film;

(2) Unestablished CAD technique optimized to a phase shift film;

(3) Existence of a pattern to which no phase shift film can be put;

(4) Necessity of using a negative type resist (in relation to problem (3); and (5) Unestablished technique for inspection and correction.

Under these circumstances, the phase shift mask method cannot be easily practiced in the semiconductor device manufacturing processes.

An exposure method and apparatus which attains enhanced resolution through an appropriately structured illumination device, has been proposed in Japanese patent application No. 28631/1991, filed in Japan on Feb. 22, 1991, in the name of the assignee of the subject application.

In this exposure method and apparatus, such an oblique projection illumination system is adopted wherein particular attention is paid to a high spatial frequency region around a $k_1$ factor of 0.5. This illumination system assures a deep depth of focus in the high spatial frequency region.

SUMMARY OF THE INVENTION

Practical semiconductor device manufacturing processes include on one hand a process wherein high resolution of a pattern is required and, on the other hand, a process wherein a not so high resolution of a pattern is required. Thus, what is desired currently is a projection exposure apparatus which can meet the requirement of various resolution performances to be satisfied in various processes.

It is accordingly an object of the present invention to provide a variable or adaptable illumination device or a projection exposure apparatus using the same, by which a suitable illumination method appropriate to the resolution actually required can be selectively assured without decreasing the efficiency of utilization of light.

In accordance with an aspect of the present invention, there is provided an illumination device in which a light emitting portion is disposed in the neighborhood of a first focal point of an elliptical mirror. By using the light from the light emitting portion and through the elliptical mirror, an image of the light emitting portion is formed in the neighborhood of a second focal point of the elliptical mirror. Light from the image of the light emitting portion is projected through an optical integrator having a plurality of small lenses disposed two-dimensionally to illuminate a surface to be illuminated. An optical device is disposed demountably out of the light path, between the elliptical mirror and the integrator, to deflect the light in a predetermined direction, to thereby change the light intensity distribution at the light entrance surface of the integrator.

In accordance with another aspect of the present invention, there is provided an illumination device in which a light emitting portion is disposed in the neighborhood of a first focal point of an elliptical mirror. By using the light from the light emitting portion and through the elliptical mirror, an image of the light emitting portion is formed in the neighborhood of a second focal point of the elliptical mirror. This image is imaged again by an imaging system on the light entrance surface of an optical integrator having a plurality of small lenses disposed two-dimensionally, and a surface to be illuminated is illuminated with the light from the exit surface of the integrator. An optical device is disposed demountably out of the light path, adjacent to the pupil plane of the imaging system, to deflect the light in a predetermined direction, to thereby change the light intensity distribution at the light entrance surface of the integrator.

In accordance with a further aspect of the present invention, there is provided an illumination device in which light from a light source is projected through an optical integrator having small lenses disposed two-dimensionally to illuminate the surface to be illuminated. Between the light source and the integrator, an optical device for deflecting light in a predetermined direction is demountably inserted to the light path, to thereby change the light intensity distribution at the entrance surface of the integrator.

In accordance with a further aspect of the invention, there is provided an illumination device in which a light emitting portion is disposed in the neighborhood of a first focal point of an elliptical mirror. By using the light from the light emitting portion and through the elliptical mirror, an image of the light emitting portion is formed in the neighborhood of a second focal point of the elliptical mirror. Light from the image of the light emitting portion is projected through an optical integrator having a plurality of small lenses disposed two-dimensionally to illuminate a surface to be illuminated. An optical device including at least two prism members is disposed demountably out of the light path, between the elliptical mirror and the integrator, to deflect the light in a predetermined direction, so as to allow selection of a first state in which a light intensity distribution, of rotationally symmetric, having a higher intensity at its central portion than at the peripheral portion is defined at the entrance surface of the integrator and a second state in which the light intensity distribution having a higher intensity at the peripheral portion than at the central portion is defined at the entrance surface of the integrator.

In another aspect, the invention provides a method of manufacturing microdevices such as semiconductor memories, liquid crystal panels, magnetic heads or CCDs, for example, using an illumination device such as above.

In a further aspect, the invention provides an exposure apparatus for manufacture of microdevices that uses an illumination device such as above.

The deflecting member usable in the present invention may be of the type that it refracts light at its light deflecting surface to shape or divide the light, or that it reflects the light at its deflecting surface to shape or divide the light.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic view of a main portion of a first embodiment of the present invention.

FIGS. 7A and 7B are schematic views, respectively, of a modified form of prism member usable in the present invention.

FIGS. 8A and 8B are schematic views, respectively, of a further modified form of a prism member usable in the present invention.

FIG. 9 is a schematic view of a portion of a second embodiment of the present invention.

FIGS. 10A-10C are schematic views, respectively, each for explaining a portion of a third embodiment of the present invention.

FIGS. 11A and 11B are schematic views, respectively, each for explaining the optical function of the third embodiment.

FIGS. 12A and 12B are schematic views, respectively, each for further explaining the optical function of the third embodiment.

FIGS. 13A and 13B are graphs, respectively, each showing an example of a light intensity distribution in the third embodiment of the present invention.

FIGS. 14A and 14B are graphs, respectively, each showing a further example of a light intensity distribution in the third embodiment of the present invention.

FIGS. 15A-15C are schematic views, respectively, each showing a main portion of a fourth embodiment of the present invention.

FIG. 16 is a schematic view of a main portion of a fifth embodiment of the present invention.

FIGS. 18A and 18B are schematic views for explaining a portion of FIG. 17.

FIGS. 19A and 19B are schematic views for further explaining a portion of FIG. 17.

FIGS. 20A-20C are schematic views, respectively, each for explaining the state of incidence of light upon a light entrance plane 10a of an optical integrator 10 of FIG. 17.

FIG. 21 is a schematic view of an apertured stop.

DESCRIPTION OF THE PREFERRED EMBODIMENTS

Figure 2A:
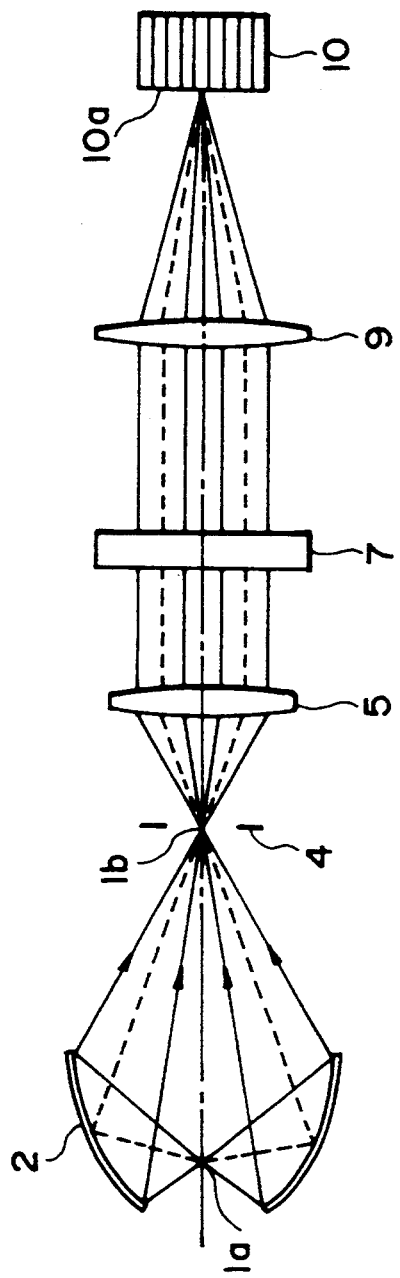
FIGS. 2A, 2B and 2C are schematic views, respectively, for explaining a portion of FIG. 1.

FIG. 1 is a schematic view of an illumination device and a projection exposure apparatus using the same, according to an embodiment of the present invention. In this embodiment, the invention is applied to a reduction projection type exposure apparatus, called a stepper. This exposure apparatus can be used for manufacture of microdevices such as semiconductor memories, CCDs, liquid crystal panels or a magnetic head, for example.

Denoted in the drawing at 1 is a light source such as a high luminance ultra high pressure Hg lamp, for example, for emitting ultraviolet light or deep UV light. The light source 1 has its light emitting portion 1a disposed adjacent to the first focal point of an elliptical mirror 2.

The light emanating from the light source 1 is reflected and collected by the elliptical mirror 2, and then it is reflected by a cold mirror 3 by which an image 1b of the light emitting portion 1a (an image of the light source) is formed in the neighborhood of the second focal point 4 of the elliptical mirror 2. The cold mirror 3 has a multilayered film and it mainly serves to transmit infrared light but to reflect ultraviolet light.

Denoted at 101 is an imaging system having two lens systems 5 and 9. It serves to image the light source image 1b, formed in the neighborhood of the second focal point 4, upon an entrance plane 10a of an optical integrator 10 through the cooperation of an optical device 8. The optical device 8 comprises a prism member 6 having a conical prism, for deflecting received light to a predetermined direction, and a parallel flat plate 7 for projecting received light directly.

Denoted at 8a is a holding member by which the prism member 6 and the parallel plate 7 of the optical device 8 can be alternately and selectively placed on the light path. When the parallel plate 7 is on the path, the imaging system 101 is defined as a telecentric system on the exit side. The optical device 8 is disposed in the neighborhood of the pupil plane of the imaging system, where the opening of the elliptical mirror is imaged.

The optical integrator 10 comprises a plurality of small lenses which are arrayed two-dimensionally, and it serves to define a secondary light source 10c in the neighborhood of the exit surface 10b thereof. Denoted at 11 is a stop member having a plurality of apertures. The stop member is provided with a mechanism by which the shape of an aperture on the light path can be changed. To the secondary light source 10c, the stop member 11 is disposed in such a region in which discrete secondary light source elements do not overlap.

Denoted at 14a is a lens system for collecting the light from the exit surface 10b of the optical integrator 10 and for illuminating, through the stop member 11 and a mirror 13 as well as a collimator lens 14b, a reticle (surface to be illuminated) 15 placed on a reticle (surface to be illuminated) 15 placed on a reticle stage 16. The lens system 14a and the collimator lens 14b constitute a condensing lens system 14.

Denoted at 17 is a projection optical system for projecting, in a reduced scale, a pattern formed on the reticle 15 upon the surface of a wafer 18 which is placed on a wafer chunk 19. Denoted at 20 is a wafer stage on which the wafer chuck 19 is mounted. In this embodiment, with the condensing lens system 14, an image of the secondary light source 10c formed in the neighborhood of the exit surface 10b of the optical integrator 10, is formed in the neighborhood of a pupil 17a of the projection optical system 17.

Next, description will be made of the manner of changing the light intensity distribution of the image of the secondary light source, which image is formed at the pupil plane 17a of the projection optical system 17, in accordance with the present embodiment by changing the light intensity distribution at the light entrance surface 10a of the optical integrator 10 through the optical device 8.

Figure 2C:
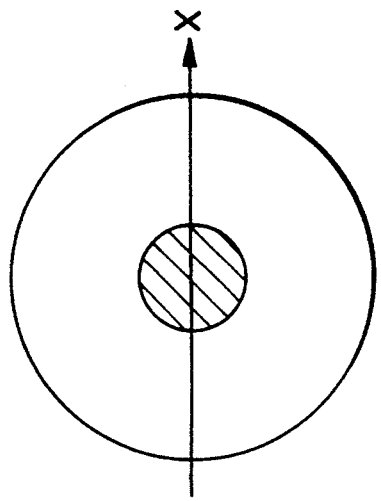
Figure 2B:
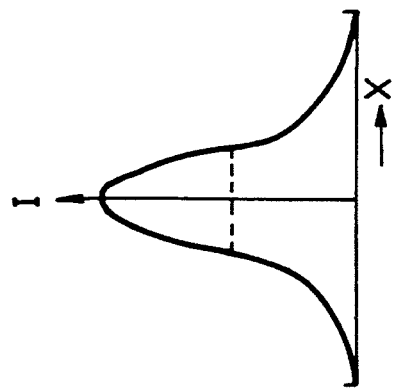
Figure 3A:
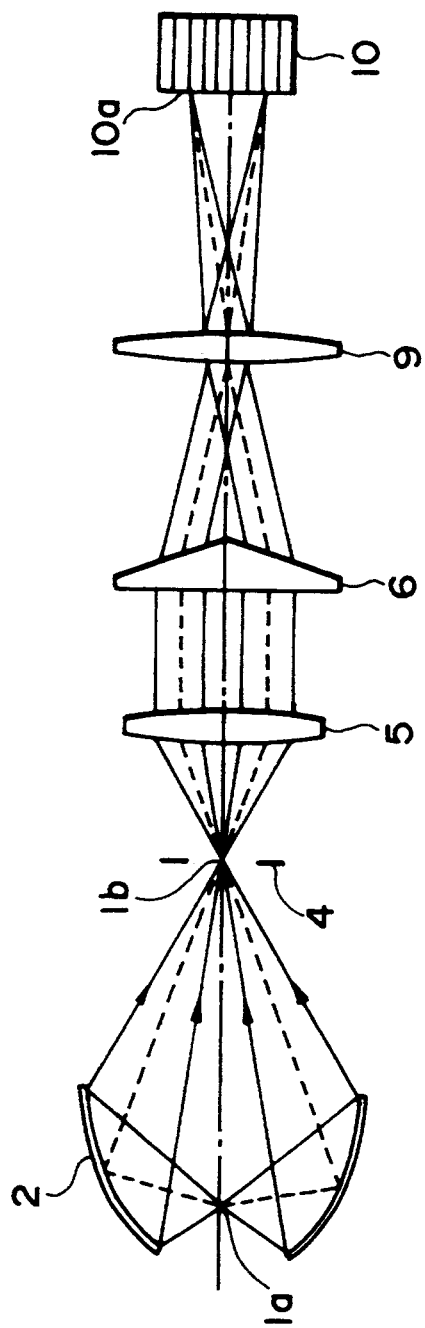
FIGS. 3A, 3B and 3C are schematic views, respectively, for explaining a portion of FIG. 1.

FIGS. 2A and 3A each illustrate the light path from the elliptical mirror 2 (FIG. 1) to the optical integrator 10, the path being extended. The mirror 3 is not shown in FIG. 2A or 3A. The illustrations of FIGS. 2A-2C and 3A-3C explain that the light intensity distribution upon the entrance surface 10a of the optical integrator 10 is changed by alternately selecting the elements 6 and 7 of the optical device 8.

Figure 3C:
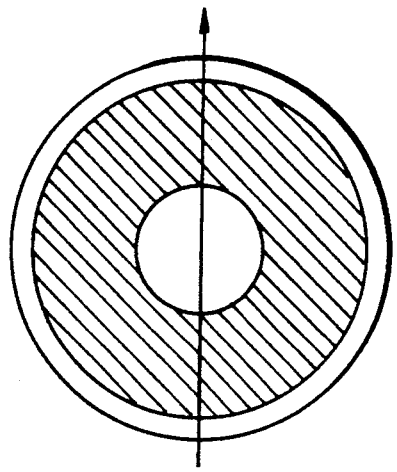
Figure 3B:
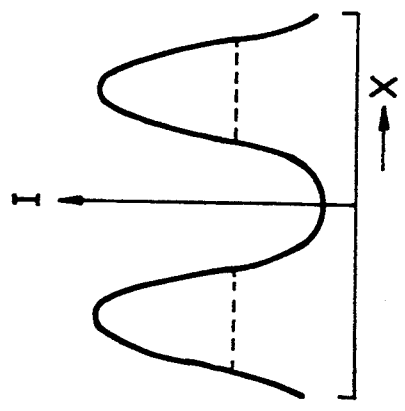

FIGS. 2A-2C correspond to a case where the parallel plate 7 of the optical device 8 is disposed on the light path, whereas FIGS. 3A-3C correspond to a case where the prism member 6 of the optical device 8 is disposed on the light path.

The illumination system of FIG. 2A is adapted for a first state of projection in which a very high resolution is not required but in which a larger depth of focus is assured. The illumination system of FIG. 3A is adapted for a second state of projection in which a high resolution is required mainly.

FIGS. 2C and 3C each is a schematic representation of a light intensity distribution upon the light entrance surface 10a of the optical integrator 10. The zone depicted by hatching in the drawings denotes the region of higher light intensity, as compared with the remaining region. FIGS. 2B and 3B illustrate a distribution of light intensity I along the X-axis direction (FIG. 2C or 3C).

In FIG. 2A, the parallel plate 7 of the optical device 8 is disposed on the light path, and the light source image 1b as formed at the second focal point 4 of the elliptical mirror 2 is imaged by the imaging system 101 upon the light entrance surface 10a of the optical integrator 10. Here, as seen in FIG. 2B, the light intensity distribution in section upon the light entrance surface 10a of the optical integrator 10 has an approximately Gaussian shape which is rotationally symmetric.

In FIG. 3A, the prism member 6 of the optical device 8 is placed on the light path, and the light source image (point image) 1b formed at the second focal point 4 of the elliptical mirror 2 is imaged, into a ring-like shape, on the light entrance surface 10a of the optical integrator 10 by the imaging system 101. The light intensity distribution on the light entrance surface 10a of the integrator 10 has a ring-like shape such as shown in FIGS. 3B or 3C wherein the light intensity is lower at the optical axis portion but is higher at the peripheral portion. Why this is so will now be explained below.

Figure 4:
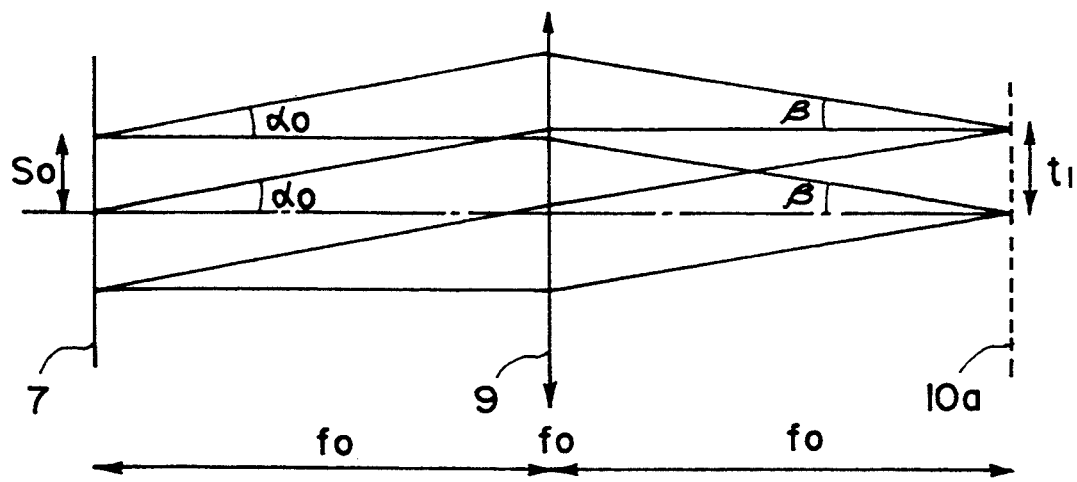
FIG. 4 is a schematic view for explaining the optical function of a lens system 9 of FIG. 1.

FIG. 4 schematically illustrates the disposition of the parallel flat plate 7, the lens system 9 and the light entrance surface 10a of the optical integrator 10 of FIG. 2A. In this embodiment, these elements are so disposed that the optical distance between the parallel plate 7 and the forward principal point of the lens system 9 as well as the optical distance between the backward principal point of the lens system 9 and the light entrance surface 10a of the integrator 10 are, if the focal length of the lens system 9 is denoted by $f_0$, both equal to a distance $f_0$.

Here, the incidence height $t_1$, from the optical axis, of the light emanating from the parallel plate 7 with an angle $\alpha_0$ and impinging on the light entrance surface 10a is expressed as follows:

$$t_1 = f_0 \cdot \tan \alpha_0$$

If the height, from the optical axis, of the outermost light passing through the parallel plate 7 is denoted by $S_0$, then the angle $\beta$ of incidence upon the light entrance surface 10a of the integrator is given by:

$$\beta = \tan^{-1}(S_0/f_0)$$

It is seen therefrom that, by deflecting the angle of light at the position of the parallel plate 7 (i.e., the forward focal plane of the lens system 9), it is possible to change only the position of incidence of light upon the entrance surface 10a of the optical integrator without changing the angle of incidence.

Based on the optical principle described, in the present embodiment, by interchanging the parallel plate 7 by the prism member 6 comprising a conical prism, the light intensity distribution on the entrance surface 10a of the integrator 10 is changed into a ring-like intensity distribution having a lower intensity at the optical axis portion and a higher intensity at the peripheral portion.

Since the light intensity distribution on the entrance surface 10a of the integrator 10 corresponds to the light intensity distribution of an effective light source which is defined at the pupil plane 17a of the projection optical system 17, by using the prism member 6 in place of the parallel plate 7 such an effective light source having a light intensity distribution having a lower intensity at a central portion (optical axis portion) and a higher intensity at a peripheral portion is defined on the pupil plane of the projection optical system.

In this embodiment, the stop member 11 is provided in the neighborhood of the exit surface 10b of the optical integrator 10. This stop member has a plurality of apertures and is provided with a mechanism for changing, as desired, the aperture shape thereof. The aperture shape which is variable is predetermined and it corresponds to the shape of the secondary light source to be formed at the pupil plane 17a of the projection optical system 17. For example, the stop member may have a ring-like aperture of a property for passing a larger quantity of light at its peripheral portion than at its central portion.

In this embodiment, the selection of the prism member 6 of the optical device 8 singley or the selection of the prism member 6 together with the changing of the aperture shape of the stop member 11 in combination, assures a desired shape of effective light source while attaining a high efficiency of light utilization.

It is to be noted that the provision of the stop member 11 is not a requisition in this embodiment.

With the arrangement of this embodiment as described above, for a reticle 15 pattern having a relatively large minimum linewidth, the structure shown in FIG. 2A is selected (like an illumination system of conventional type), whereby a Gaussian shaped light intensity distribution is provided at the entrance surface 10a of the optical integrator 10 (first state).

On the other hand, for a pattern having a relatively small minimum linewidth, the structure shown in FIG. 3A is selected to provide a ring-like light intensity distribution at the entrance surface 10a of the integrator 10. Also, the aperture shape of the stop member 11 is changed. By this, an illumination device for high resolution projection is assured (second state).

The insertion of the parallel plate 7 in the first state of FIG. 2A is to minimize the difference in optical path length between the lens systems 5 and 9, as compared with that in the case where the prism member 6 is inserted in the second state. If the prism member 6 has a small thickness or if a slight change in optical path length between the lens systems 5 and 9 does not influence the optical performance of the optical integrator 10 or of any other optical elements following it, the parallel plate 7 may be omitted.

Figure 5:
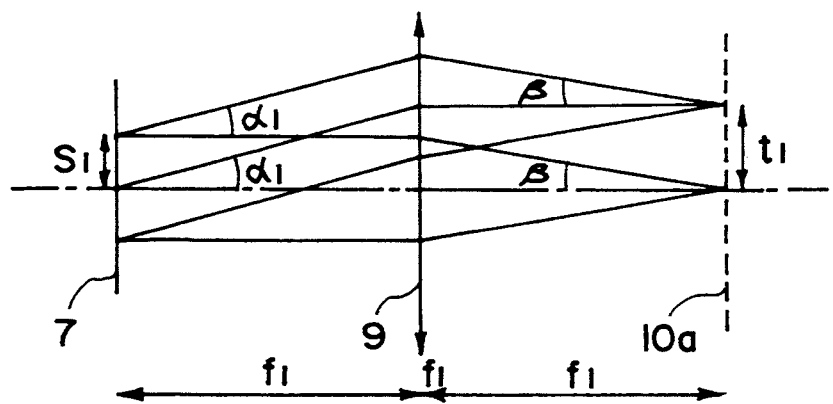
FIG. 5 is a schematic view for further explaining the optical function of the lens system 9 of FIG. 1.
Figure 6:
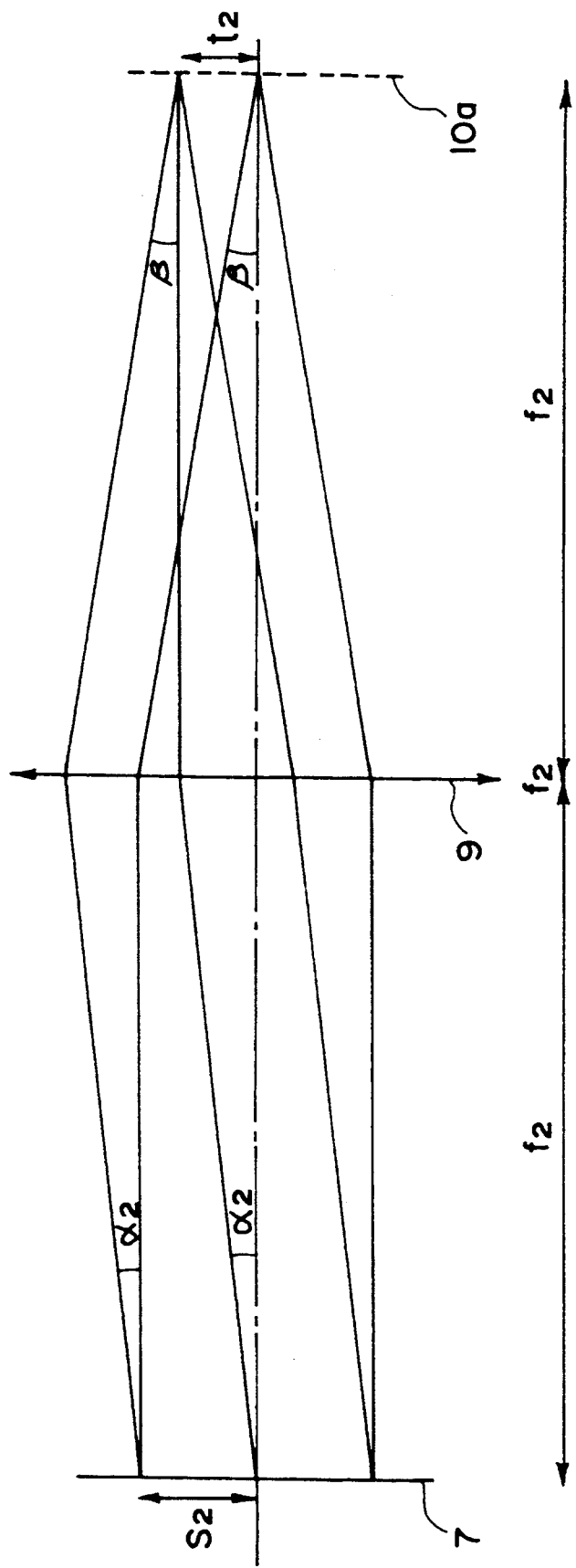
FIG. 6 is a schematic view for further explaining the optical function of the lens system 9 of FIG. 1.

FIGS. 5 and 6 are schematic representations for explaining the relationship of the incidence height (heights $t_1$ and $t_2$ from the optical axis) at the entrance surface 10a of the optical integrator 10, relative to the position (exit heights $S_1$ and $S_2$) and deflection angle ($\alpha_1$ and $\alpha_2$) of light passing through the parallel plate 7, where in the present embodiment the focal length f of the lens system 9 constituting the imaging system 101 is changed.

If in FIG. 5 the focal length of the lens system 9 is $f_1$, then $t_1 = f_1 \tan\alpha_2$ applies. Also, in FIG. 6, if the focal length of the lens system 9 is $f_2$, then $t_2 = f_2 \tan\alpha_2$ applies.

It is seen from these equations that if the focal length of the lens system 9 is made large then it is possible to obtain, at the entrance surface 10a of the optical integrator 10, an incidence position $t_1$ of desired height with a small deflection angle $\alpha$ at the position of the parallel plate 7. This means that if the focal length f of the lens system 9 is made large then it is possible to make small the angle of the prism member 6 (prism angle) in the second state. This assures an imaging system 101 of smaller aberration. Practically, in consideration of the size of the prism member 6, the focal length of the lens system 9 may be so set to define a prism angle of 5–20 deg.

The prism member 6 of the optical device of the present invention is not limited to a conical prism. It may have any shape provided that it has a function for deflecting received light in a predetermined direction. For example, pyramidal prisms such as shown in FIGS. 8A and 8B may be used.

FIGS. 7B and 8B schematically illustrate a light intensity distribution on the entrance surface 10a of the integrator 10 when the prism member such as shown in FIG. 7A or 8A is used. The zones depicted by hatching denote regions of higher intensity as compared with the remaining region.

It is possible in the present invention to use three or more types of interchangeable optical members such as prisms and a parallel plate, rather than only two optical members of the prism 6 and the parallel plate 7 are interchanged as in the present embodiment.

Further, the pyramidal prism such as shown in FIG. 7A may be rotated about the optical axis, for smoothing with respect to time, to provide a ring-like light intensity distribution such as shown in FIG. 3C.

Still further, the light source 1 may be displaced along the optical axis concurrently with the interchange of the prism member, to change the size of the higher light intensity region.

FIG. 9 is a schematic view of a main portion of a second embodiment of the present invention.

In this embodiment, as compared with the first embodiment of FIG. 1, a half mirror 30 is disposed on the light path at the position before (light source 1 side of) the optical integrator 10, so that a portion of the light from the imaging system 101 is directed to a photodetector 31 which may comprise a CCD or a quadrant sensor. The remaining portion is of the same structure as that of the first embodiment.

In this embodiment, the light intensity distribution at the light entrance surface 10a of the optical integrator 10 is measured indirectly to monitor the same. This allows adjustment of the imaging system 101 while monitoring changes in light intensity and/or light intensity distribution at the entrance surface 10a.

In this embodiment, a mechanism 60 for rotating the optical member 6 about the optical axis or for shifting the same with respect to the optical axis, may be used. This provides the ability to change the light intensity distribution at the entrance surface 10a of the integrator 10 into a desired shape easily.

FIGS. 10A is a schematic view of a main portion of a third embodiment of the present invention.

In this embodiment, as compared with the first embodiment of FIG. 1, in addition to the insertion of the prism member 6 into the light path, the lens system 9 is replaced by a lens system 33 of a different focal length which is disposed at the entrance face 10a side of the optical integrator 10. The remaining portion is of the same structure as that of the first embodiment.

In this embodiment, light is collected to a region narrower than the entrance surface 10a of the integrator 10, and light intensity distribution of a desired shape is obtained.

Referring now to FIGS. 11A, 11B, 12A and 12B, the optical function of this embodiment will be explained.

FIGS. 11A-12B schematically illustrate the light path from the optical device 8 (prism 6 and parallel plate 7) to the integrator 10. FIGS. 13A, 13B, 14A and 14B show a light intensity distribution at the entrance surface 10a of the integrator 10, defined by using the prism member 6 or the parallel plate 7.

FIG. 11A shows the arrangement where, in the first embodiment, a conventional type illumination is to be done. Generally, the angle of light rays that can enter the optical integrator is determined and, in the example of FIG. 11A, the angle is $\theta_1$. Thus, the optical system before the integrator 10 is designed so that the angle of incidence upon the integrator 10 becomes not greater than the angle $\theta$. Here, in the light intensity distribution at the entrance surface 10a of the integrator 10, the degree of convergence is limited due to Lagrange's invariant. For example, it is not possible to improve the degree of convergence beyond that of FIG. 13A. An attempt to obtain a higher degree of convergence simply ends in that the angle of incidence upon the integrator 10 goes beyond the angle $\theta$.

FIG. 11B shows the state where, in the first embodiment, the prism member 6 is inserted into the light path. FIG. 13B shows a corresponding light intensity distribution at the entrance surface 10a. Here, the maximum incidence angle of the light upon the entrance surface 10a, at the point $S_1$, is $\theta_1$ the same as in the FIG. 11A example. However, the effective light angle of the light that actually enters is $\theta_2$.

As seen from FIG. 12A, with the provision of an optical device 32 (which may comprise a prism or a field lens) in front of the entrance surface 10a, it is possible to reduce the maximum incidence angle. FIG. 14A shows a corresponding light intensity distribution at the entrance surface 10a.

Here, since the maximum incidence angle is loosened, by shortening the focal length of the optical system from the prism 6 to the optical integrator it is possible to obtain a higher degree of convergence. FIG. 12B shows an example wherein the degree of convergence. FIG. 12B shows an example wherein the degree of convergence is improved on the basis of such an optical principle just described. A corresponding light intensity distribution is shown in FIG. 13B. In the example of FIG. 12B, the prism member 6 has an enlarged prism angle so as to obtain a light intensity distribution of a ring-like shape.

In this embodiment, the insertion of the prism member 6 as described causes shift of the angle of incidence at the entrance surface 10a of the integrator 10 with the maximum incidence angle being unchanged. By correcting such shift and optimizing the incidence angle, the incidence angle is loosened. Thus, it becomes possible to increase the degree of convergence to the limit where the incidence angle becomes equal to the critical incidence angle.

Practical means for this end may be using a zoom system for the optical system from the prism member 6 to the integrator 10; using interchangeable optical systems; provision of a prism (conical prism where the prism member 6 comprises a conical prism; a pyramidal prism where the prism member 6 comprises a pyramidal prism) in front of the integrator 10; insertion of an aspherical lens; or an appropriate combination of them.

FIGS. 15A-15C are schematic views of a portion of a fourth embodiment of the present invention.

In this embodiment, as compared with the first embodiment of FIG. 1, the position of the optical device 8 (the position of prism member 6 and/or parallel plate 7) is shifted from the pupil of the imaging system 101 and the focal length of the optical system 9 is changed, to thereby converge the light intensity distribution at the entrance surface 10a of the optical integrator 10. The remaining portion is of the same structure as that of the first embodiment.

In FIGS. 15A-15C, reference character P denotes the pupil plane of the lens system 9. FIG. 15A shows the first state of illumination in the first embodiment. The angle of incidence upon the integrator 10 is $\theta$. FIG. 15B shows the second state of illumination in the first embodiment, and the incidence angle is $\theta$ the same as in the FIG. 11A example. Here, if the prism member 6 is shifted from the pupil plane P and the beam diameter on the plane P is reduced such as shown in FIG. 15C, then it is possible to make the incidence angle $\theta'$ smaller than the angle $\theta_2$ of the FIGS. 11A and 11B examples. In the present embodiment, on this occasion, the focal length of the lens system 9 is changed so as to assure that the light intensity distribution at the entrance surface 10a of the integrator 10 is collected and converged locally.

FIG. 16 is a schematic view of a main portion of a fifth embodiment of the present invention.

In this embodiment, as compared with the first embodiment of FIG. 1, the lens system 5 constituting the imaging system 101 is omitted and the opening 2a of the elliptical mirror 2 is imaged by the lens system 9 upon the entrance surface 10a of the optical integrator 10. Also, the optical device 8 is disposed in the neighborhood of the second focal point of the elliptical mirror 2. The remaining portion is of the same structure as that of the first embodiment.

More specifically, in the embodiment of FIG. 1, an image of the light emitting portion 1a of the light source 1 is formed on the entrance surface 10a of the integrator 10, and the optical device 8 is disposed in the neighborhood of the imaging position of the opening 2a of the elliptical mirror 2 (the position of the image of the opening 2a) which is between the light source 1 and the integrator 10.

In the present embodiment, as compared, the image of the opening 2a of the elliptical mirror 2 is formed on the entrance surface 10a of the integrator 10, and the optical device 8 is disposed at the imaging position of the light emitting portion 1a (the second focal point position of the elliptical mirror 2) which is between the light source 1 and the optical integrator 10.

Thus, in this embodiment, the forward focal point position of the lens system 9 is placed substantially at the second focal point position of the elliptical mirror 2, and by the lens system 9, the light from the light source image 1b at the second focal point is transformed into substantially parallel light which is then directed to the entrance surface 10a of the integrator 10. When the prism member 6 is being inserted and if it is of the type such as shown in FIG. 7A, four parallel lights from the lens system 9 are projected on the entrance surface 10a of the integrator 10.

Figure 17:
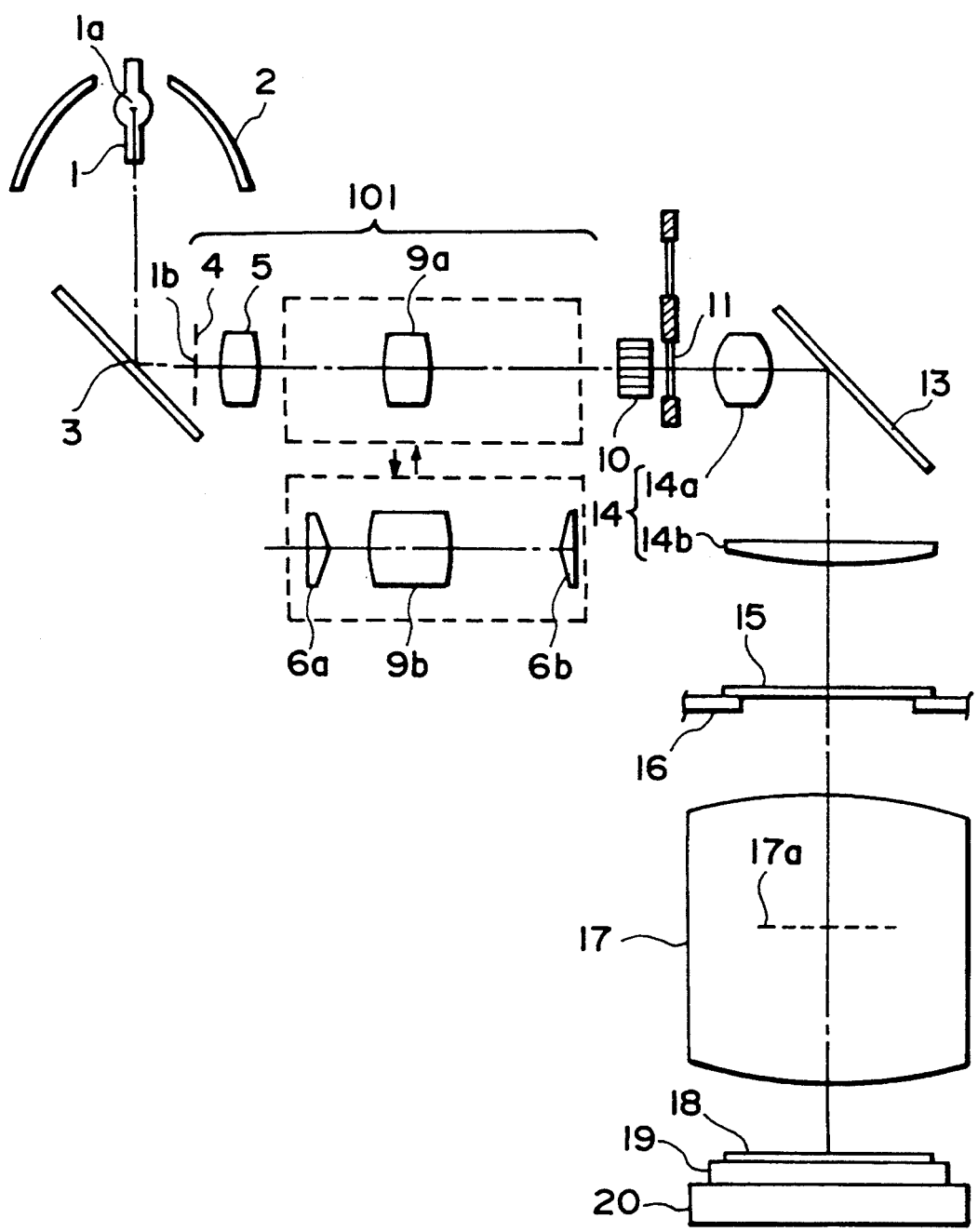
FIG. 17 is a schematic view of a main portion of a sixth embodiment of the present invention.

FIG. 17 is a schematic view of a main portion of a sixth embodiment of the present invention.

In this embodiment, as compared with the first embodiment of FIG. 1, the optical device 8 comprises at least two prism members 6a and 6b disposed along the optical axis and, for changing the light intensity distribution at the entrance surface 10a of the integrator 10, namely, for rendering the illumination system into the second state, the optical device 8 (prism members 6a and 6b) is mounted on the optical axis and, additionally, a portion of the lens system 9a constituting the imaging system 101 is replaced by another lens system 9b so as to reduce the incidence angle of an off-axis principal ray to the entrance surface 10a. This is done for efficient utilization of light.

In the illumination method of this embodiment, in the first state the lens system 9a is placed on the light path (the optical device 8 is not used), so at to provide a light intensity distribution at the entrance surface 10a of the integrator 10, that is, a light intensity distribution at the pupil plane 17a of the projection optical system 17, which distribution is of a rotationally symmetric shape wherein the intensity is higher at the central portion than at the peripheral portion.

The second state is defined by placing the optical device 8 (prism members 6a and 6b) on the light path and by replacing the lens system 9a by the lens system 9b having a different focal length. This makes smaller the angle of incidence of the principal ray upon the entrance surface 10a of the integrator 10, whereby at this entrance surface 10a, namely, at the pupil plane 17a of the projection optical system 17, such a light intensity distribution in which the intensity is higher in the peripheral portion than in the central portion is provided.

Structural features of this embodiment over the first embodiment will be explained in more detail.

In FIG. 17, lens system 5 collects the light from the light source image 1b formed in the neighborhood of the second focal point 4, and it emits parallel light. The imaging system 101 (lens systems 5 and 9a) is telecentric on the exit side. At least a portion of the collecting lens 14 is made movable along the optical axis, to adjust the light intensity distribution on the reticle 15.

In this embodiment, in accordance with the orientation and/or the linewidth to be resolved of the pattern of the reticle 15, for example, the lens system 9a which is a constituent element of the imaging system 101 is replaced by the optical device 8 (including two prisms 6a and 6b) and the lens system 9b, to change the light intensity distribution at the entrance surface 10a of the integrator 10. Additionally, if necessary, the aperture shape of the stop member 11 is changed to change the light intensity distribution of the image of the secondary light source which image is formed at the pupil plane 17a of the projection optical system 17.

Next, the manner of changing in this embodiment the light intensity distribution on the entrance surface 10a of the integrator 10 as well as the light intensity distribution of the image of the secondary light source to be formed on the pupil plane 17a of the projection optical system 17, on the basis of the optical device 8, will be explained.

FIGS. 18A through 19B each schematically illustrate the light path from the elliptical mirror 2 to the optical integrator 10 of FIG. 17, the path being extended. The mirror 3 is not shown in Figure these figures. The illustrations of Figures these figures explain that the components of the optical device 8 are interchanged to change the light intensity distribution on the entrance surface 10a of the integrator 10.

FIG. 18A shows the state in which the lens system 9a is placed on the light path. FIG. 19A shows the state in which the lens system 9a is removed and, in place thereof, the prism members 6a and 6b of the optical device 8 and the lens system 9b are placed on the light path.

The illumination system of FIG. 18A is in the first state of projection in which a very high resolution is not required but a large depth of focus is assured, as in the illumination method of a conventional type. The illumination system of FIG. 19A is in the second state of projection, according to the present invention, mainly for attaining high resolution.

FIG. 18B and FIG. 19B each schematically shows a corresponding light intensity distribution on the entrance surface 10a of the integrator 10. The zone depicted by hatching denotes the region of higher intensity as compared with the remaining region. In these illustrations, the distribution of light intensity I along the X-axis direction are depicted.

FIGS. 20A, 20B and 20C are schematic representations, for explaining the light rays impinging on the optical integrator 10, in the systems of FIGS. 18A and 19A. Reference characters $+\theta$ and $-\theta$ each denotes the range (angle) of light rays that can enter the optical integrator 10 (that can emerge from the integrator without being eclipsed). A grid portion in each illustration depicts the zone in which the light intensity is higher than that of the light entering the integrator 10.

FIG. 18A shows the optical arrangement in ordinary illumination. Here, the light intensity distribution at the entrance face 10a of the integrator 10 is like a Gaussian distribution such as shown in FIG. 18B. The incidence angle thereof is such as shown in FIG. 20A. When in this state the illumination for high resolution is to be done, there may be a method in which a stop 121 having an aperture 121a such as shown in FIG. 21 is inserted at the back of or in front of the integrator 10. However, with this method, only the light in the hatched zone of the light intensity distribution of FIG. 18A, can be used and, therefore, the illuminance decreases considerably.

In this embodiment, in consideration thereof, as shown in FIG. 19A the lens system 9a is replaced by the lens system 9b of smaller focal length (the optical components are disposed so that, if the focal length of the lens system 9b is $f_{9b}$, the optical distance between the prism 6a and the lens system 9b and the optical distance between the lens system 9b and the entrance surface 10a of the integrator 10 are both equal to $f_{9b}$), such that the light intensity distribution as shown in FIG. 19B, is provided at the entrance surface 10a of the integrator 10.

Additionally, the prism member 6b having an appropriate prism angle is inserted in front of the integrator 10, by which the incidence angle of light rays (incidence angle of off-axis light) is made smaller such as shown in FIG. 20C. This assures efficient impingement or entrance of light into the integrator 10. Thus, almost all the input light can be used for the illumination.

On the basis of the optical principle described above, the present embodiment uses the optical arrangement such as shown in FIG. 19A, by which illumination for high resolution is assured without a substantial loss of illuminance at the surface to be illuminated.

The prism member 6a or 6b of pyramidal shape provided within the imaging system 101 may have a shape such as shown in FIG. 8, for example. Of course, it may be a conical prism.

While the embodiment has been explained with reference to an example wherein the lens system 9a of FIG. 18A for ordinary illumination is replaced by the lens system 9b of FIG. 19A for high resolution illumination, the lens elements of the lens system 9a may be displaced (like a zoom lens system) to define the same condition as by the lens system 9b. Only some of the lens elements may be moved like a zoom lens system or, alternatively, some lens elements may be replaced by different lens elements.

The stop member 121 for high resolution such as shown in FIG. 21 may be used as desired, or it may be omitted. Further, while in this embodiment the focal length of the lens system 9a is changed to change the magnification of the imaging system 101, the focal length of the lens system 5 may be changed. Alternatively, both of the focal lengths of the lens systems 5 and 9 may be changed.

In this embodiment, there are cases wherein, in response to the interchange of the ordinary illumination (first state) and the illumination for high resolution (second state), uniformness in illuminance (non-uniformness of illuminance) upon the surface being illuminated changes into axial symmetry. On that occasion, a portion of the optical system 14 may be displaced along the optical axis to change aberration such as distortion to thereby correct for the axially symmetric non-uniformness of illuminance upon the surface (reticle 15 surface) to be illuminated.

While in the preceding embodiment the reticle 15 (surface to be illuminated) is disposed just after the optical system 14, an additional imaging system may be disposed between the optical system 14 and the reticle such that a plane which is optically conjugate with the reticle 15 surface with respect to the additional imaging system may be illuminated.

Figure 22:
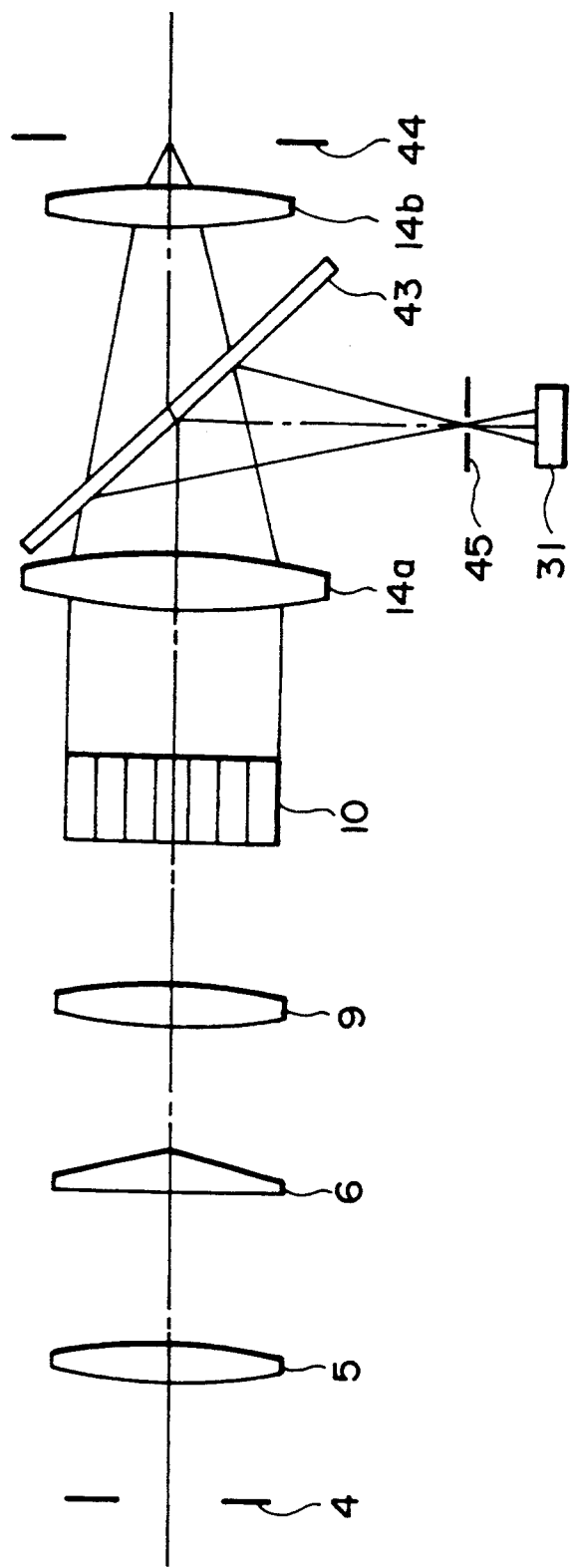
FIG. 22 is a schematic view of a main portion of a seventh embodiment of the present invention.

FIG. 22 is a schematic view of a main portion of a seventh embodiment of the present invention.

In this embodiment, as compared with the first embodiment of FIG. 1, a half mirror 43 is disposed between the integrator 10 and the surface 15 to be illuminated, so as to allow detection of the amount of exposure of the surface being illuminated. The remaining portion is of substantially the same structure as that of the first embodiment.

In FIG. 22, denoted at 44 is the reticle pattern surface or a plane which is optically conjugate with the reticle pattern surface. Denoted at 45 is a pinhole member which is disposed at a position optically conjugate with the plane 44. Denoted at 33 is a photosensor (e.g., a CCD or quadrant sensor).

With this arrangement of the present embodiment, it is possible to monitor the effective light source distribution at the center of the surface being illuminated. Also, in this embodiment it is possible to concurrently monitor, with the photodetector 31, the amount of exposure of the surface being illuminated.

While in this embodiment the half mirror 43 is placed between the lens system 13a and the collimator lens 14b, it may be disposed at any position between the integrator 10 and the surface 15.

In accordance with the present invention, in consideration of fineness and/or orientation of a pattern of a reticle to be projected and transferred, an illumination system suited to such pattern can be selected.

While the invention has been described with reference to the structures disclosed herein, it is not confined to the details set forth and this application is intended to cover such modifications or changes as may come within the purposes of the improvements or the scope of the following claims.

What is claimed is:

1. An illumination device, comprising:
    secondary light source forming means having a deflecting member with a conical light deflecting surface for transforming received light into substantially ring-like light, said secondary light source forming means forming a ring-like secondary light source by using the ring-like light; and
    an optical system for projecting divergent lights from portions of the secondary light source obliquely onto a surface to be illuminated so that the projected lights are superposed one upon another on the surface.

2. A device according to claim 1, wherein said secondary light source forming means comprises a light source, reflecting means for reflecting the light from said light source and for forming an image of said light source, an optical integrator, and an imaging optical system for re-imaging the light source image, wherein said imaging optical system includes parallelizing means for transforming the light from the light source image into substantially parallel light, and collecting means for collecting the ring-like light from said deflecting member substantially into a ring-like shape upon said integrator.

3. A device according to claim 2, wherein said deflecting member is demountably mounted to the path of light to be received.

4. A device according to claim 3, wherein said imaging optical system comprises an optical system having a variable imaging magnification.

5. A device according to claim 3, further comprising means for moving said deflecting member in a direction intersecting with the optical axis of said imaging optical system.

6. A device according to claim 3, further comprising means for rotating said deflecting member about the optical axis.

7. A device according to claim 3, further comprising a second light deflecting member for reducing the angle of incidence of the ring-like light upon said integrator.

8. A device according to claim 7, wherein said second light deflecting member comprises a prism having a conical light deflecting surface.

9. A device according to claim 7, wherein said second light deflecting member comprises a field lens.

10. An exposure apparatus for exposing a substrate to a mask with light, said apparatus comprising:
    secondary light source forming means having a deflecting member with a conical light deflecting surface for transforming received light into substantially ring-like light, said secondary light source forming means forming a ring-like secondary light source by using the ring-like light; and an optical system for projecting divergent lights from portions of the secondary light source obliquely onto a surface to be illuminated so that the projected lights are superposed one upon another on the surface.

11. An apparatus according to claim 10, wherein said secondary light source forming means comprises a light source, reflecting means for reflecting the light from said light source and for forming an image of said light source, an optical integrator, and an imaging optical system for re-imaging the light source image, wherein said imaging optical system includes parallelizing means for transforming the light from the light source image into substantially parallel light, and collecting means for collecting the ring-like light from said deflecting member substantially into a ring-like shape upon integrator.

12. An apparatus according to claim 11, wherein said deflecting member is demountably mounted to the path of light to be received.

13. An apparatus according to claim 12, wherein said image optical system comprises an optical system having a variable imaging magnification.

14. An apparatus according to claim 12, further comprising means for moving said deflecting member in a direction intersecting with the optical axis of said imaging optical system.

15. An apparatus according to claim 14, further comprising means for rotating said deflecting member about the optical axis.

16. An apparatus according to claim 14, further comprising a second light deflecting member for reducing the angle on incidence of the ring-like light upon said integrator.

17. An apparatus according to claim 16, wherein said second light deflecting member comprises a prism having a conical light deflecting surface.

18. An apparatus according to claim 16, wherein said second light deflecting member comprises a field lens.

19. An apparatus according to claim 10, further comprising means for imaging a pattern of the mask onto the substrate.

20. A device manufacturing method including a step of exposing a workpiece to a mask, said method comprising the steps of:
projecting light onto a light deflecting surface of conical shape to produce substantially ring-like light;
forming a secondary light source by using the ring-like light;
projecting lights from portions of the secondary light source obliquely onto the mask so that the lights are superposed one upon another on the mask.

21. A method according to claim 20, wherein a pattern of the mask is imaged on the workpiece.

22. An illumination device, comprising:
a light source;
an optical integrator;
an imaging optical system for imaging said light source, said imaging optical system including (i) parallelizing means for transforming light from said light source into substantially parallel light, (ii) a deflecting member having a light deflecting surface of one of conical shape or pyramidal shape, for receiving the light from said parallelizing means, and (iii) light collecting means for collecting ring-like light or a plurality of lights from said deflecting member into a substantially ring-like shape or a plurality of light spots upon said optical integrator;
an optical system for projecting lights from portions of a secondary light source formed by said integrator obliquely upon a surface to be illuminated so that the lights are superposed one upon another on the surface; and
means for changing a positional relationship between an apex of said light deflecting surface and the optical axis.

23. A device according to claim 22, wherein said deflecting member is demountably mounted to the path of light from said light source.

24. A device according to claim 23, wherein said imaging optical system comprises an optical system having a variable imaging magnification.

25. A device according to claim 23, further comprising means for rotating said deflecting member about the optical axis.

26. A device to claim 23, further comprising a second light deflecting member for reducing the angle of incidence of the ring-like light or the plurality of lights upon said integrator.

27. A device according to claim 26, wherein said second light deflecting member comprises a prism having a conical light deflecting surface.

28. A device according to claim 26, wherein said second light deflecting member comprises a field lens.

29. An exposure apparatus for exposing a substrate to a mask with light, said apparatus comprising:
a light source;
an optical integrator;
an imaging optical system for imaging said light source, said imaging optical system including (i) parallelizing means for transforming light from said light source into substantially parallel light, (ii) a deflecting member having a light deflecting surface of one of conical shape or pyramidal shape, for receiving the light from said parallelizing means, and (iii) light collecting means for collecting ring-like light or a plurality of lights from said deflecting member into a substantially ring-like shape or a plurality of light spots upon said optical integrator;
an optical system for projecting lights from portions of a secondary light source formed by said integrator obliquely upon a surface to be illuminated so that the lights are superposed one upon another on the surface; and
means for changing a positional relationship between an apex of said light deflecting surface and the optical axis.

30. An apparatus according to claim 29, wherein said imaging optical system comprises first image forming means for reflecting light from said light source and for forming an image of said light source, and second image means for re-imaging the light source image, wherein said second image forming means includes said parallelizing means, said deflecting member and said collecting means.

31. An apparatus according to claim 29, wherein said deflecting member is demountably mounted to the path of light from said light source.

32. An apparatus according to claim 29, wherein said imaging optical system comprises an optical system having a variable imaging magnification.

33. An apparatus according to claim 29, further comprising means for rotating said deflecting member about the optical axis.

34. An apparatus according to claim 29, further comprising a second light deflecting member for reducing the angle of incidence of the ring-like light or the plurality of lights upon said integrator.

35. An apparatus according to claim 34, wherein said second light deflecting member comprises a prism having a conical light deflecting surface.

36. An apparatus according to claim 34, wherein said second light deflecting member comprises a field lens.

37. An apparatus according to claim 29, further comprising means for imaging a pattern of the mask onto the substrate.

38. A device manufacturing method including a step of exposing a workpiece to a mask with a light, said method comprising the steps of:
projecting light to a light deflecting surface of conical shape or pyramidal shape to form ring-like light or a plurality of lights;
forming a secondary light source by using the ring-like light or the plurality of lights;
wherein, in said projecting step and said secondary light source forming step, the positional relationship between an apex of the light deflecting surface and the optical axis is changed to provide the secondary light source of a desired intensity distribution; and
projecting divergent lights from portions of the secondary light source obliquely upon the mask so that the lights are superposed one upon another on the mask.

39. A method according to claim 38, wherein a pattern of the mask is imaged on the workpiece.

40. An illumination device, comprising:
a light source;
an optical integrator;
an imaging optical system for imaging said light source, said imaging optical system including (i) parallelizing means for transforming light from said light source into substantially parallel light, (ii) a first deflecting member having a light deflecting surface of one of conical shape or pyramidal shape, for receiving the light from said parallelizing means, and (iii) light collecting means for collecting ring-like light or a plurality of lights from said first deflecting member into a substantially ring-like shape or a plurality of light spots upon said optical integrator; and
an optical system for projecting lights from portions of a secondary light source formed by said integrator obliquely upon a surface to be illuminated so that the lights are superposed one upon another on the surface;
wherein said collecting means of said imaging optical system includes a second deflecting member effective to reduce the angle of incidence upon said integrator of the ring-like light or of the plurality of lights; and
wherein said first and second deflecting members are provided in a pair demountably mounted.

41. A device according to claim 40, wherein said imaging optical system comprises an optical system having a variable imaging magnification.

42. A device according to claim 40, further comprising means for moving said first deflecting member in a direction intersecting with the optical axis of said imaging optical system.

43. A device according to claim 40, further comprising means for rotating said first deflecting member about the optical axis.

44. A device according to claim 40, wherein each of said first and second deflecting members comprise a prism having a conical light deflecting surface.

45. A device according to claim 40, wherein each of said first and second deflecting members comprise a prism having a pyramidal light deflecting surface.

46. A device according to claim 40, wherein said second deflecting member comprises a field lens.

47. A device according to claim 40, wherein said imaging optical system comprises first image forming means for reflecting light from said light source and for forming an image of said light source, and second image forming means for re-imaging the light source image, wherein said second image forming means includes said parallelizing means, said deflecting member and said collecting means.

48. An exposure apparatus for exposing a substrate to a mask with light, said apparatus comprising:
a light source;
an optical integrator;
an imaging optical system for imaging said light source, said imaging optical system including (i) parallelizing means for transforming light from said light source into substantially parallel light, (ii) a first deflecting member having a light deflecting surface of one of conical shape or pyramidal shape, for receiving the light from said parallelizing means, and (iii) light collecting means for collecting ring-like light or a plurality of lights from said first deflecting member into a substantially ring-like shape or a plurality of light spots upon said optical integrator; and
an optical system for projecting lights from portions of a secondary light source formed by said integrator obliquely upon a surface to be illuminated so that the lights are superposed one upon another on the surface;
wherein said collecting means of said imaging optical system includes a second deflecting member effective to reduce the angle of incidence upon said integrator of the ring-like light or of the plurality of lights; and
wherein said first and second deflecting members are provided in a pair demountably mounted.

49. An apparatus according to claim 48, wherein said imaging optical system comprises an optical system having a variable imaging magnification.

50. An apparatus according to claim 48, further comprising means for moving said first deflecting member in a direction intersecting with the optical axis of said imaging optical system.

51. An apparatus according to claim 48, further comprising means for rotating said first deflecting member about the optical axis.

52. An apparatus according to claim 48, wherein each of said first and second deflecting members comprise a prism having a conical light deflecting surface.

53. An apparatus according to claim 48, wherein each of said first and second deflecting members comprise a prism having a pyramidal light deflecting surface.

54. An apparatus according to claim 48, wherein said second deflecting member comprises a field lens.

55. An apparatus according to claim 48, wherein said imaging optical system comprises first image forming means for reflecting light from said light source and for forming an image of said light source, and second image forming means for re-imaging the light source image, wherein said second image forming means includes said parallelizing means, said deflecting member and said collecting means.

56. An apparatus according to claim 48, further comprising means for imaging a pattern of the mask on the substrate.

57. A device manufacturing method including a step of exposing a workpiece to a mask, said method comprising the steps of:
   projecting parallel light on a first deflecting surface of conical shape or pyramidal shape to produce ring-like light or a plurality of lights;
   projecting the ring-like light or the plurality of lights to form a secondary light source;
   wherein in said secondary light source forming step, the ring-like light or the plurality of lights are deflected by a second deflecting surface to reduce the angle of incidence thereof upon the plane; and
   projecting divergent lights from portions of the secondary light source obliquely onto the mask so that the lights are superposed one upon another on the mask;
   wherein the first and second deflecting surfaces are provided in a pair demountably mounted; and
   wherein the parallel light can be projected to an approximately central portion of the plane, when the first and second deflecting surfaces are not present.

58. A method according to claim 57, wherein a pattern of the mask is imaged on the workpiece.

59. An illumination device, comprising:
   a light source;
   an imaging optical system for imaging said light source, said imaging optical system including (i) parallelizing means for transforming light from said light source into substantially parallel light, (ii) a deflecting member having a light deflecting surface of one of conical shape or pyramidal shape, for receiving the light from said parallelizing means, and (iii) light collecting means for collecting ring-like light or a plurality of lights from said deflecting member into a substantially ring-like shape or a plurality of light spots upon said optical integrator;
   an optical system for projecting lights from portions of a secondary light source formed by said integrator obliquely upon a surface to be illuminated so that the lights are superposed one upon another on the surface; and
   means for changing the positional relationship between an apex of said deflecting surface and the optical axis.

60. An illumination device, comprising:
   a light source;
   an imaging optical system for imaging said light source, said imaging optical system including (i) parallelizing means for transforming light from said light source into substantially parallel light, (ii) a first deflecting member having a light deflecting surface of one of conical shape or pyramidal shape, for receiving the light from said parallelizing means, and (iii) light collecting means for collecting ring-like light or a plurality of lights from said first deflecting member into a substantially ring-like shape or a plurality of light spots upon a plane; and
   an optical system for projecting lights from portions of a secondary light source formed by the light from said first deflecting member, obliquely upon a surface to be illuminated so that the lights are superposed one upon another on the surface;
   wherein said collecting means of said imaging optical system includes a second deflecting member effective to reduce the angle of incidence upon said plane of the light from said first deflecting surface; and
   wherein said first and second deflecting members are provided in a pair demountably mounted.

* * * * *

UNITED STATES PATENT AND TRADEMARK OFFICE
CERTIFICATE OF CORRECTION

PATENT NO. : 5,345,292
DATED : September 6, 1994
INVENTOR(S) : Takahisa SHIOZAWA, et al.

It is certified that error appears in the above-indentified patent and that said Letters Patent is hereby corrected as shown below:

ON THE COVER PAGE: (Item 56)

UNDER "U.S. PATENT DOCUMENTS":

"4,931,830 1/1990 Suwa et al." should read
--4,931,830 6/1990 Suwa et al.--.
"5,237,367 5/1993 Kudo" should read
--5,237,367 8/1993 Kudo--.

IN THE ABSTRACT: (Item 57)

Line 2, "device," should read --device--.

COLUMN 1:

Line 56, "corporation. Here" should read --Corporation. Here--.

COLUMN 8:

Line 8, "$t_1=f_1 \tan\alpha_2$" should read --$t_1=f_1 \tan\alpha_1$--.

COLUMN 11:

Line 26, "at" should read --as--.

UNITED STATES PATENT AND TRADEMARK OFFICE
CERTIFICATE OF CORRECTION

PATENT NO. : 5,345,292
DATED : September 6, 1994
INVENTOR(S) : Takahisa SHIOZAWA, et al.

It is certified that error appears in the above-indentified patent and that said Letters Patent is hereby corrected as shown below:

COLUMN 12:

Line 6, "Figure" should be deleted;
    Line 7, "these figures" should read --18A and 19A--; and
    Line 54, "FIG. 19A" should read --FIG. 19A,--.

COLUMN 15:

Line 16, "integrator." should read --said integrator.--;
    Line 21, "image" should read --imaging--;
    Line 32, "on" should read --of--; and
    Line 49, "light;" should read --light; and--.

COLUMN 16:

Line 18, "device" should read --device according--; and
    Line 53, "image" (second occurrence) should read --image forming--.

Signed and Sealed this

Eighteenth Day of April, 1995

Attest:

BRUCE LEHMAN

Attesting Officer

Commissioner of Patents and Trademarks